United States Patent
Fan et al.

(10) Patent No.: US 6,473,357 B1
(45) Date of Patent: Oct. 29, 2002

(54) BITLINE/DATALINE SHORT SCHEME TO IMPROVE FALL-THROUGH TIMING IN A MULTI-PORT MEMORY

(75) Inventors: Junfei Fan, Mississippi State; Jeffery Scott Hunt, Ackerman, both of MS (US); Daniel E. Cress, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/675,895

(22) Filed: Sep. 29, 2000

(51) Int. Cl.$^7$ ................................................. G11C 8/00
(52) U.S. Cl. .................. 365/230.05; 365/154; 365/190; 365/204; 365/220; 365/221; 365/239
(58) Field of Search ........................... 365/230.05, 154, 365/190, 204, 220, 221, 239, 189.01, 129, 230.01

(56) References Cited

U.S. PATENT DOCUMENTS

| 4,580,245 | A | * | 4/1986 | Siegler | 365/154 |
|---|---|---|---|---|---|
| 4,802,122 | A | | 1/1989 | Auvinen et al. | 365/154 |
| 5,253,207 | A | * | 10/1993 | Shikatani | 365/189.04 |
| 5,673,234 | A | | 9/1997 | Hawkins et al. | 365/239 |
| 5,790,461 | A | * | 8/1998 | Holst | 365/189.04 |
| 5,862,092 | A | | 1/1999 | Hawkins et al. | 365/221 |
| 5,894,432 | A | * | 4/1999 | Lotfi | 365/154 |

* cited by examiner

Primary Examiner—Hoai Ho
(74) Attorney, Agent, or Firm—Christopher P. Maiorana, P.C.

(57) ABSTRACT

An apparatus comprising a memory array having a first port and a one or more other ports and a control circuit configured to couple (i) a bitline of the first port to a corresponding bitline of the one or more other ports and (ii) a dataline of the first port to a corresponding dataline of the one or more other ports in response to the first port and the one or more other ports accessing a common address.

20 Claims, 7 Drawing Sheets

BITLINE/DATALINE SHORT SCHEME TO IMPROVE FALL-THROUGH TIMING IN A MULTI-PORT MEMORY

FIELD OF THE INVENTION

The present invention relates to a method and/or architecture for improving fall-through timing in a multi-port memory generally and, more particularly, to a method and/or architecture for implementing a bitline/dataline short to improve fall-through timing in a multi-port memory.

BACKGROUND OF THE INVENTION

In a conventional dual port memory, the read port access time is slowed down when data has to be written into a memory cell before data can be read from the memory cell. Similarly, a read operation in a conventional first in, first out (FIFO) memory is delayed when the write port accesses the same memory cell address as the read port. The dual port memory fall-through access time and the FIFO fall-through empty flag skew time are increased because of the write before read delay.

Referring to FIG. 1, a schematic diagram illustrating a conventional six transistor (6-T) memory cell 10 is shown. The memory cell 10 includes a NMOS transistor 12, a NMOS transistor 14, an inverter 16, and an inverter 18. The memory cell 10 also includes a write bitline WBL, a write wordline WWL, a read wordline RWL, and a read bitline bar RBLB. An NMOS transistor 20 external to the circuit 10 couples the write bitline bar WBLB to the read bitline bar RBLB in response to a signal SHORT. The NMOS transistors 12 and 14 are configured as pass gates.

Referring to FIG. 2, a block diagram of a circuit 30 illustrating a conventional FIFO memory is shown. The circuit 30 is shown as a single ended implementation. However, the description of the circuit 30 fall-through time is also applicable to a conventional dual ended memory design. The circuit 30 has a write data path circuit 32, a memory array 34, a read data path circuit 36, a read/write equal (WREQ) logic circuit 38, and a local short logic circuit 40.

A FIFO can have a dedicated read port and a dedicated write port. The memory array 34 can include a plurality of the 6-T memory cell memory cells implemented similarly to the 10 of FIG. 1. Fall-through timing is slowed when the write port 32 has the same address as the read port 36. The read port 36 access time will be slowed down, because the data has to be written into the memory cell 10 before the data can be read out.

A specific time is needed to write into a memory cell 10 (i.e., a write-through time). An additional time is needed to read out of the memory cell 10. The actual time taken to perform both the write and then the read operation at the particular memory cell can be lengthy. The specification for the operation to write to and read from the same memory cell simultaneously (i.e., the fall-through time) is always a longer time than the specification for a read operation where no writing is involved. The fall-through time of a conventional memory can be twice as long as the normal read access time.

To overcome the above problem, the WREQ logic circuit 38 compares a read pointer RADDRESS and a write pointer WADDRESS. The WREQ logic circuit 38 generates a signal ROW_MATCH when the write address and the read address are pointing to the same row. The local short logic circuit 40 generates the signal SHORT in response to the signals ROW_MATCH and COL_ADDRESS. The signal SHORT switches on the transistor 20 in a selected column to short (couple) the write bitline bar WBLB with the read bitline bar RBLB. Any time there is a row address match, the write bitline bar WBLB and the read bitline bar RBLB of the memory cells 10 in the selected column are shorted together. The read address and the write address are not necessarily the same address when the row address matches since the column addresses can be different. However, the signal SHORT only affects the bitlines, and not the data lines. Additionally, the signal SHORT is only active when the row addresses match.

It would be desirable to implement a method and/or architecture that reduces fall-through time and/or logic overhead.

SUMMARY OF THE INVENTION

The present invention concerns an apparatus comprising a memory array having a first port and one or more other ports and a control circuit configured to couple (i) a bitline of the first port to a corresponding bitline of the one or more other ports and (ii) a dataline of the first port to a corresponding dataline of the one or more other ports in response to the first port and the one or more other ports accessing a common address.

The objects, features and advantages of the present invention include providing a method and/or architecture for implementing a bitline/dataline short to improve fall-through timing in a multi-port memory that may (i) speed up the fall-through access time in multi-port memories, (ii) reduce array switching activity in FIFOs, (iii) short bitlines and data lines only when the same memory cell is addressed, (iv) use existing dual port arbitration logic to control bitline and dataline shorting, (v) eliminate write/read equality (WREQ) logic, (vi) reduce current during memory access, (vii) eliminate unnecessary bitline switching, (viii) be implemented in an embedded block and/or stand-alone chip designs, and/or (ix) reduce crowbar currents.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
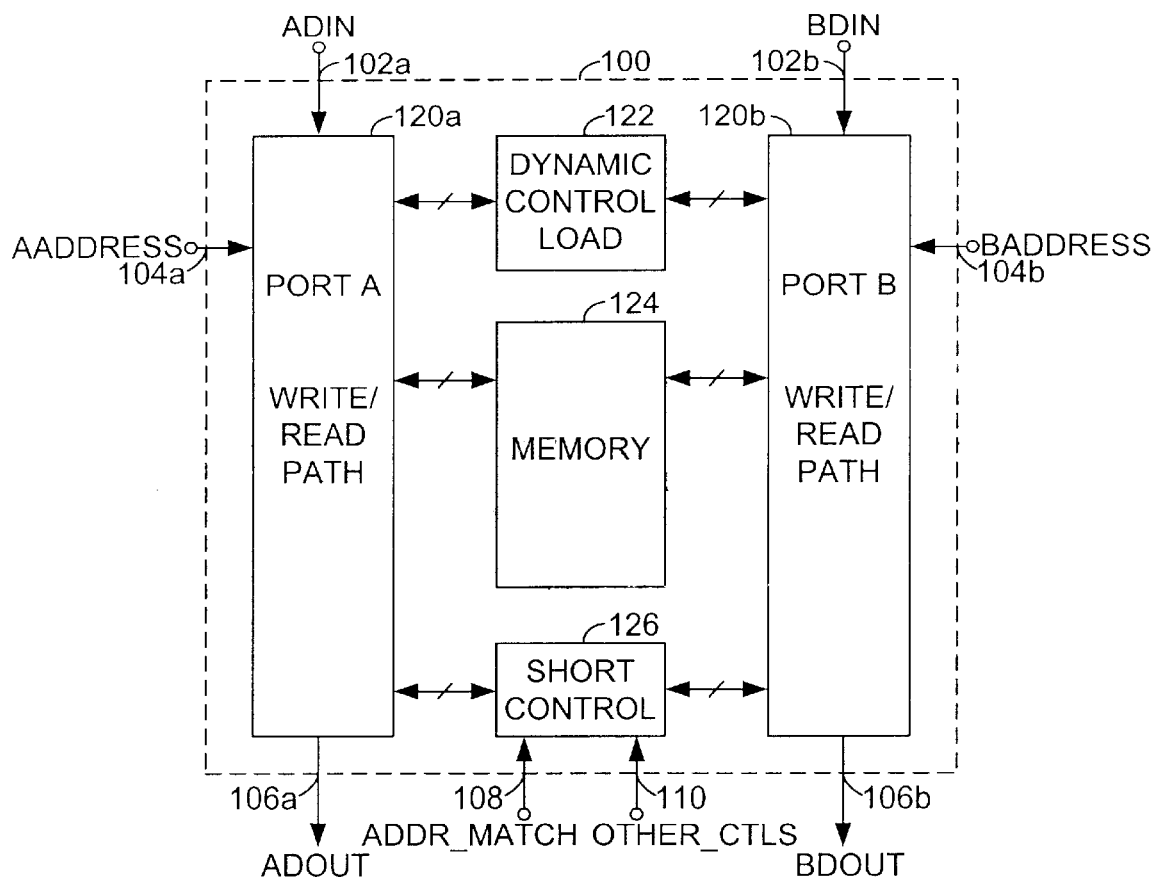
FIG. 3 is a block diagram of a preferred embodiment of the present invention.

Referring to FIG. 3, a block diagram of a circuit 100 illustrating a preferred embodiment of the present invention is shown. The circuit 100 may have a number of inputs 102a and 102b that may receive a number of signals (e.g., ADIN and BDIN, respectively), a number of inputs 104a and 104b that may receive a number of signals (e.g., AADDRESS and BADDRESS, respectively), a number of outputs 106a and 106b that may present a number of signals (e.g., ADOUT and BDOUT, respectively), an input 108 that may receive a signal (e.g., ADDR_MATCH), and an input 110 that may receive one or more signals (e.g., OTHER_CTLS). The circuit 100 is illustrated having two ports (e.g., port A and port B) to more easily describe operations. However, the circuit 100 may be implemented accordingly with any number of ports necessary to meet the design criteria of a particular application (e.g., a quad-port memory).

The signals ADIN and BDIN may be data input signals. The signals ADOUT and BDOUT may be data output signals. The signals AADDRESS and BADDRESS may be read/write addresses that may point to a particular memory cell in the circuit 100. The signal ADDR_MATCH may be a control signal. The signal ADDR_MATCH may indicate that a write address and a read address point to the same memory cell. The signal OTHER_CTLS may be, in one example, a control signal. Alternatively, the signal OTHER_CTLS may comprise any number of control signals necessary to meet the design criteria of a particular application. The circuit 100 generally comprises a circuit 120a, a circuit 120b, a circuit 122, a circuit 124, and a circuit 126. The circuits 120a and 120b may be port A and port B write/read data paths, respectively. The circuit 122 may be a dynamic column load. The circuit 124 may be a dual multi-port memory array. The circuit 126 may be a control circuit.

The signals ADIN and AADDRESS may be presented to the circuit 120a. The circuit 120a may be configured to present the signal ADOUT. The signals BDIN and BADDRESS may be presented to the circuit 120b. The circuit 120b may present the signal BDOUT. The circuits 122, 124 and 126 may be coupled between the circuits 120a and 120b. The signals ADDR_MATCH and OTHER_CTLS may be presented to the circuit 126.

Figure 4:
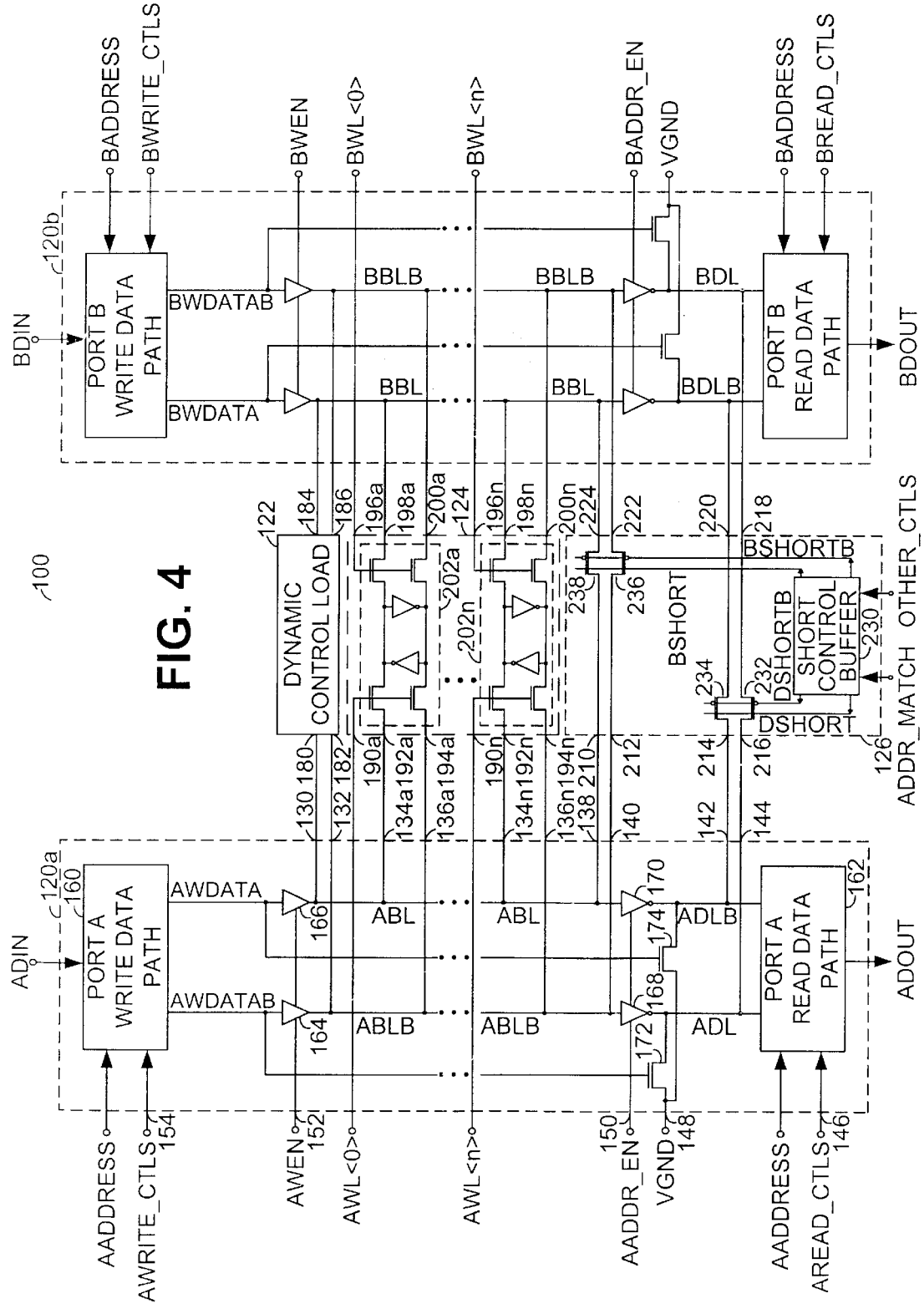
FIG. 4 is a detailed block diagram of a preferred embodiment of the present invention.

Referring to FIG. 4, a detailed block diagram of the circuit 100 illustrating a preferred embodiment of the present invention is shown. The circuit 120a may have an input that may receive the signal ADIN, an input/output 130 that may present a bitline (e.g., ABL), an input/output 132 that may present a bitline bar (e.g., ABLB), a number of input/outputs 134a–134n that may present the bitline ABL, a number of input/outputs 136a–136n that may present the bitline bar ABLB, an input/output 138 that may present the bitline ABL, an input/output 140 that may present the bitline bar ABLB, an input/output 142 that may present a dataline bar (e.g., ADLB), an input/output 144 that may present a dataline (e.g., ADL), an output that may present the signal ADOUT, an input 146 that may receive a signal (e.g., AREAD_CTLS), an input that may receive the signal AADDRESS, an input 148 that may receive a ground potential (e.g., VGND), an input 150 that may receive a signal (e.g., AADDR_EN), an input 152 that may receive a signal (e.g., AWEN), an input 154 that may receive a signal (e.g., AWRITE_CTLS).

The signal AWRITE_CTLS may be a write control signal. The signal AWEN may be a write enable signal. The signal AADDR_EN may be an address enable signal. The circuit 120a may comprise, in one example, a circuit 160, a circuit 162, a device 164, a device 166, a device 168, a device 170, a transistor 172, and a transistor 174, described in detail below in connection with FIG. 5.

The circuit 120b may be implemented similarly to the circuit 120a. However, the circuit 120b may receive/present signals BWEN and BADDR_EN, a bitline BLB, a bitline bar BLBB, a dataline BDL, and a dataline bar BDLB. A signal (e.g., BWEN) and a signal (e.g., BADDR_EN) may be control signals. A bitline (e.g., BBL) may be a second port bitline, a bitline bar (e.g., BBLB) may be a second port bitline bar, a dataline (e.g., BDL) may be a second port dataline, and a dataline bar (e.g., BDLB) may be a second port dataline bar.

The bitlines ABL and BBL and the bitline bars ABLB and BBLB may carry data signals to and from the circuit 124. The datalines ADL and BDL and the dataline bars ADLB and BDLB are generally signals generated in response to the bitlines ABL and BBL and the bitline bars ABLB and BBLB. The datalines and bitlines ADL and ADLB, BDL and BDLB, ABL and ABLB, and BBL and BBLB, respectively, may carry complementary signal pairs. However, the dataline and bitline pairs ADL and ADLB, BDL and BDLB, ABL and ABLB, and BBL and BBLB, respectively, may be at the same level under some conditions (e.g., precharge).

The circuit 122 may have an input 180 that may receive the bitline ABL, an input 182 that may receive the bitline bar ABLB, an input 184 that may receive the bitline BBL, and an input 186 that may receive the bitline bar BBLB. The circuit 122 may be a port dynamic column load circuit. The circuit 122 is used to pre-charge the bitlines before the memory 124 is accessed. The circuit 122 acts as a load when the memory 124 is being accessed.

The circuit 124 may have a number of inputs 190a–190n that may receive a number of wordlines (e.g., AWL<0>-AWL<n>), a number of input/outputs 192a–192n that may receive/present the bitline ABL, a number of input/outputs 194a–194n that may receive/present the bitline bar ABLB, a number of inputs 196a–196n that may receive a number of wordlines (e.g., BWL<0>-BWL<n>), a number of input/outputs 198a–198n that may receive/present the bitline BBL, and a number of input/outputs 200a–200n that may receive/present the bitline bar BBLB. The wordlines AWL<n> and BWL<n> may be access control signals. The circuit 124 may comprise a number of storage elements 202a–202n described below in detail in connection with FIG. 6. In one example, the circuit 124 may be a column of memory cells in a memory array.

The circuit 126 may, in one example, have an input/output 210 that may receive/present the bitline ABL, an input/output 212 that may receive/present the bitline bar ABLB, an input/output 214 that may receive/present the dataline bar ADLB, an input/output 216 that may receive/present the dataline ADL, an input that may receive the signal ADDR_MATCH, an input that may receive the signal OTHER_CTLS, an input/output 218 that may receive/present the dataline BDL, an input/output 220 that may receive/present the dataline bar BDLB, an input/output 222 that may receive/present the bitline bar BBLB, and an input/output 224 that may receive/present the bitline BBL.

The circuit 126 may comprise, in one example, a circuit 230, a device 232, a device 234, a device 236, and a device 238 described in detail below in connection with FIG. 7. The circuit 230 may be, in one example, a short control buffer.

Figure 5:
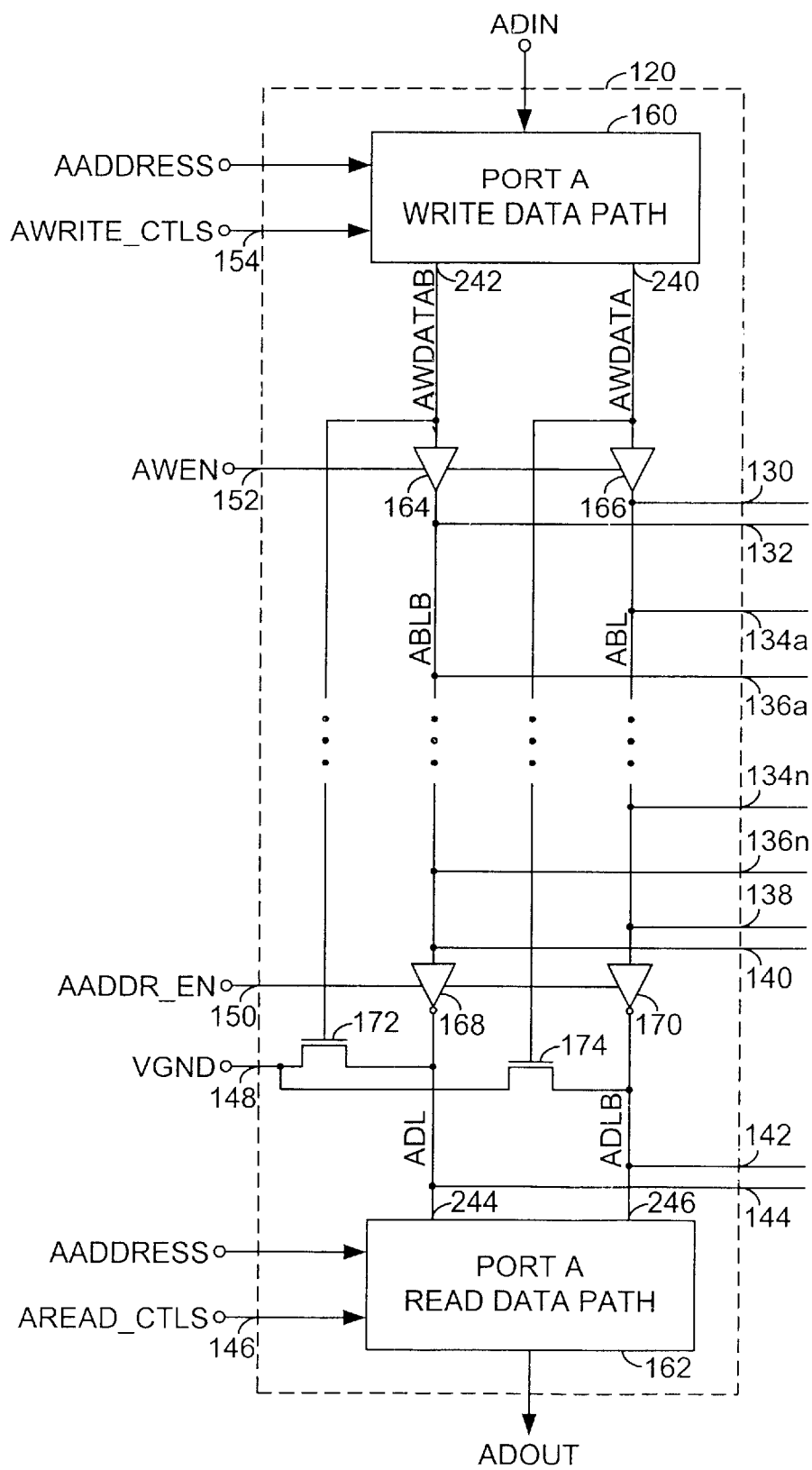
FIG. 5 is a block diagram of a port write/read data path of FIG. 3.

Referring to FIG. 5, a detailed block diagram of a circuit 120 illustrating a memory port write/read data path circuit is shown. The circuit 160 may have an input that may receive the signal ADIN, an output 240 that may present a signal (e.g., AWDATA), an output 242 that may present a signal (e.g., AWDATAB), an input that may receive the signal AWRITE_CTLS, and an input that may receive the signal AADDRESS. The signals AWDATA and AWDATAB may be data signals. The circuit 160 may be configured to present the signals AWDATA and AWDATAB in response to the signals ADIN, AADDRESS, and AWRITE_CTLS. The circuit 160 may be, in one example, a port write data path circuit.

The circuit 162 may have an output that may present the signal ADOUT, an input 246 that may receive the dataline bar ADLB, an input 244 that may receive the dataline ADL, an input that may receive the signal AADDRESS, and an input that may receive the signal AREAD_CTLS. The signal AREAD_CTLS may be a read control signal. The circuit 162 may be configured to present the signal ADOUT in response to the signals AADDRESS and AREAD_CTLS, the dataline ADL, and the dataline bar ADLB. The circuit 162 may be, in one example, a port read data path circuit.

The device 164 may be an amplifier. The device 164 may have an input that may receive the signal AWDATAB, a control input that may receive the signal AWEN, and an output that may present the bitline bar ABLB. The device 164 may be configured to present the bitline bar ABLB in response to the signals AWDATAB and AWEN.

The device 166 may be an amplifier. The device 166 may have an input that may receive the signal AWDATA, a control input that may receive the signal AWEN, and an output that may present the bitline ABL. The device 166 may be configured to present the bitline ABL in response to the signals AWDATA and AWEN.

The device 168 may be, in one example, an inverting amplifier. The device 168 may have an input that may receive the bitline bar ABLB, a control input that may receive the signal AADDR_EN, and an output that may present the dataline ADL. The device 168 may be configured to present the dataline ADL in response to the signal AADDR_EN and the bitline bar ABLB.

The device 170 may be, in one example, an inverting amplifier. The device 170 may have an input that may receive the bitline ABL, a control input that may receive the signal AADDR_EN, and an output that may present the dataline bar ADLB. The device 170 may be configured to present the dataline bar ADLB in response to the signal AADDR_EN and the bitline ABL. The devices 168 and 170 may be configured as sense amplifiers.

The transistors 172 and 174 may be implemented as one or more NMOS transistors. However, other types and polarities of transistors may be implemented accordingly to meet the design criteria of a particular application. The transistor 172 may have a source that may be connected to the ground VGND, a drain that may be connected to the dataline ADL, and a gate that may receive the signal AWDATAB.

The transistor 174 may have a source that may be connected to the ground VGND, a drain that may be connected to the dataline bar ADLB, and a gate that may receive the signal AWDATA. The transistors 172 and 174 may be configured to pull down the dataline ADL and the dataline bar ADLB to the ground VGND in response to the signals AWDATAB and AWDATA, respectively. The dataline bar ADLB or the dataline ADL may be at a first logic state (e.g., a logic high state, or "1") generated by a read operation from the circuit 124. The transistors 172 and 174 may help pull down the dataline bar ADLB or the dataline ADL to a second state (e.g., logic low, or "0").

Figure 6:
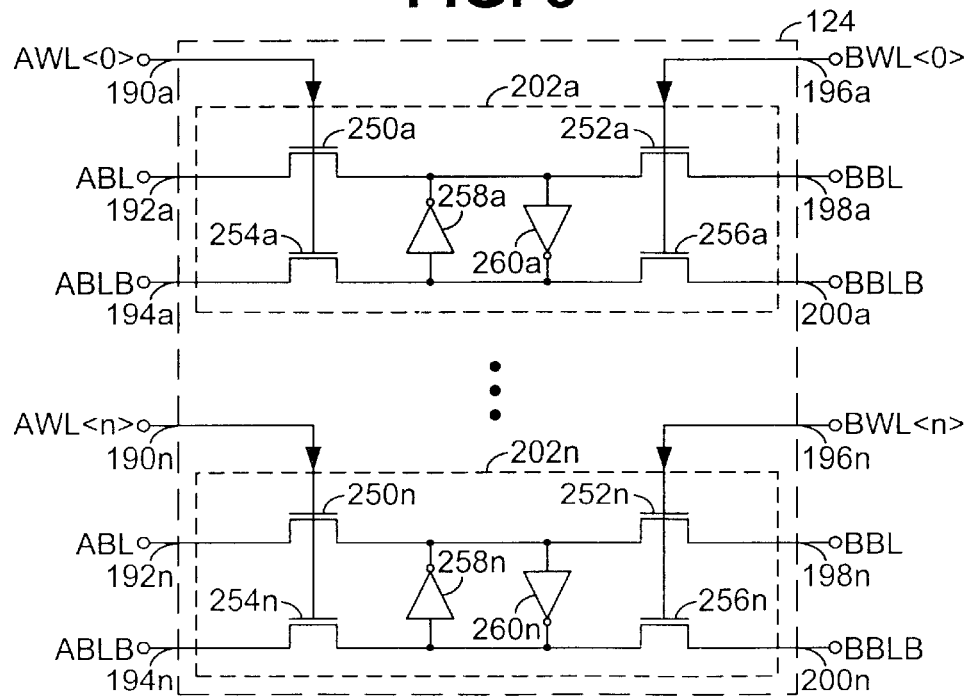
FIG. 6 is a schematic diagram of an eight transistor memory cell implementation of a memory array of FIG. 3.

Referring to FIG. 6, a schematic diagram illustrating a preferred embodiment of the circuit 124 is shown. In one example, the storage elements 202a–202n may be each implemented as an eight transistor (8-T) memory cell circuit. A representative circuit 202 may comprise, in one example, a transistor 250, a transistor 252, a transistor 254, a transistor 256, a device 258, and a device 260.

The transistor 250 may have a first source/drain that may receive the bitline ABL, a gate that may receive the wordline AWL<n>, and a second source/drain that may be connected to an output of the device 258, an input of the device 260 and a first source/drain of the transistor 252. The transistor 252 may have a second source/drain that may receive the bitline BBL and a gate that may receive the wordline BWL<n>. The transistor 254 may have a first source/drain that may receive the bitline bar ABLB, a gate that may receive the wordline AWL<n>, and a second source/drain that may be connected to an input of the device 258, and output of the device 260, and a first source/drain of the transistor 256. The transistor 256 may have a gate that may receive the wordline BWL<n> and a second source/drain that may receive the bitline bar BBLB.

The transistors 250, 252, 254, and 256 may be implemented as one or more NMOS transistors. The devices 258 and 260 may be implemented as inverters. However, other devices and/or polarities may be implemented accordingly to meet the design criteria of the particular application.

Figure 1:
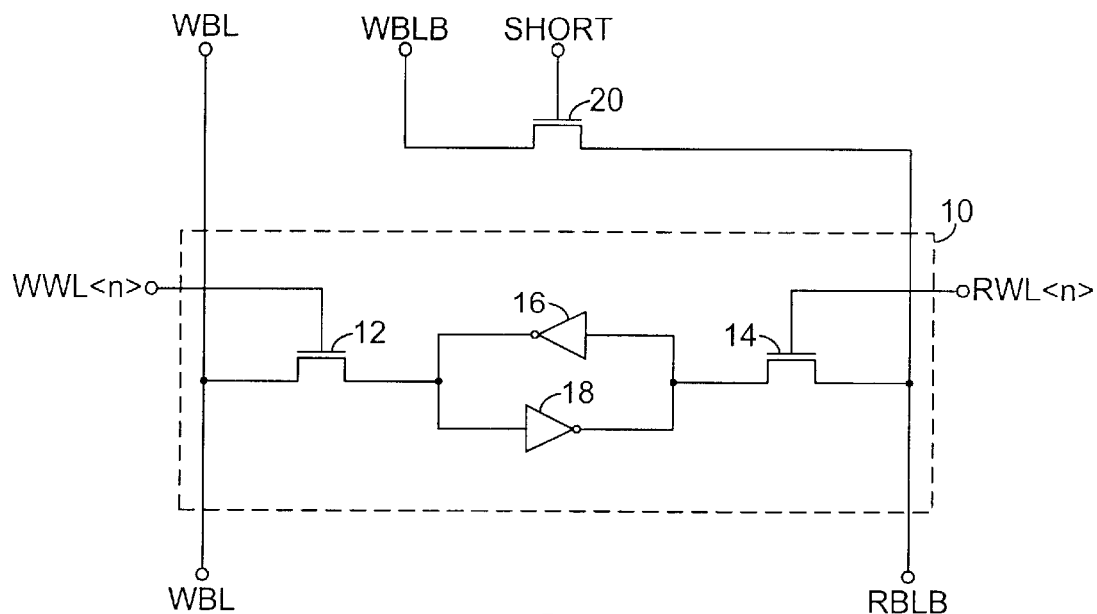
FIG. 1 is a schematic diagram of a conventional six transistor memory cell.
Figure 7:
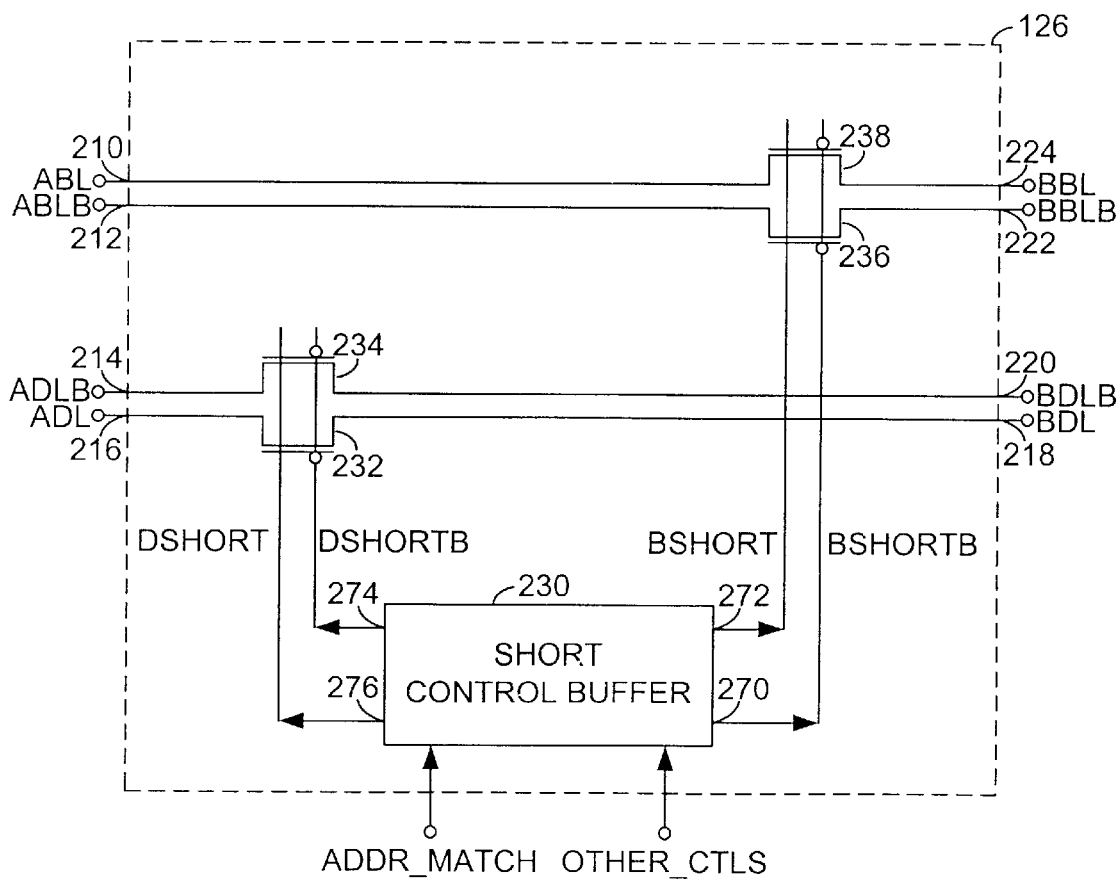
FIG. 7 is a detailed block diagram of a short control circuit of FIG. 3.
Figure 2:
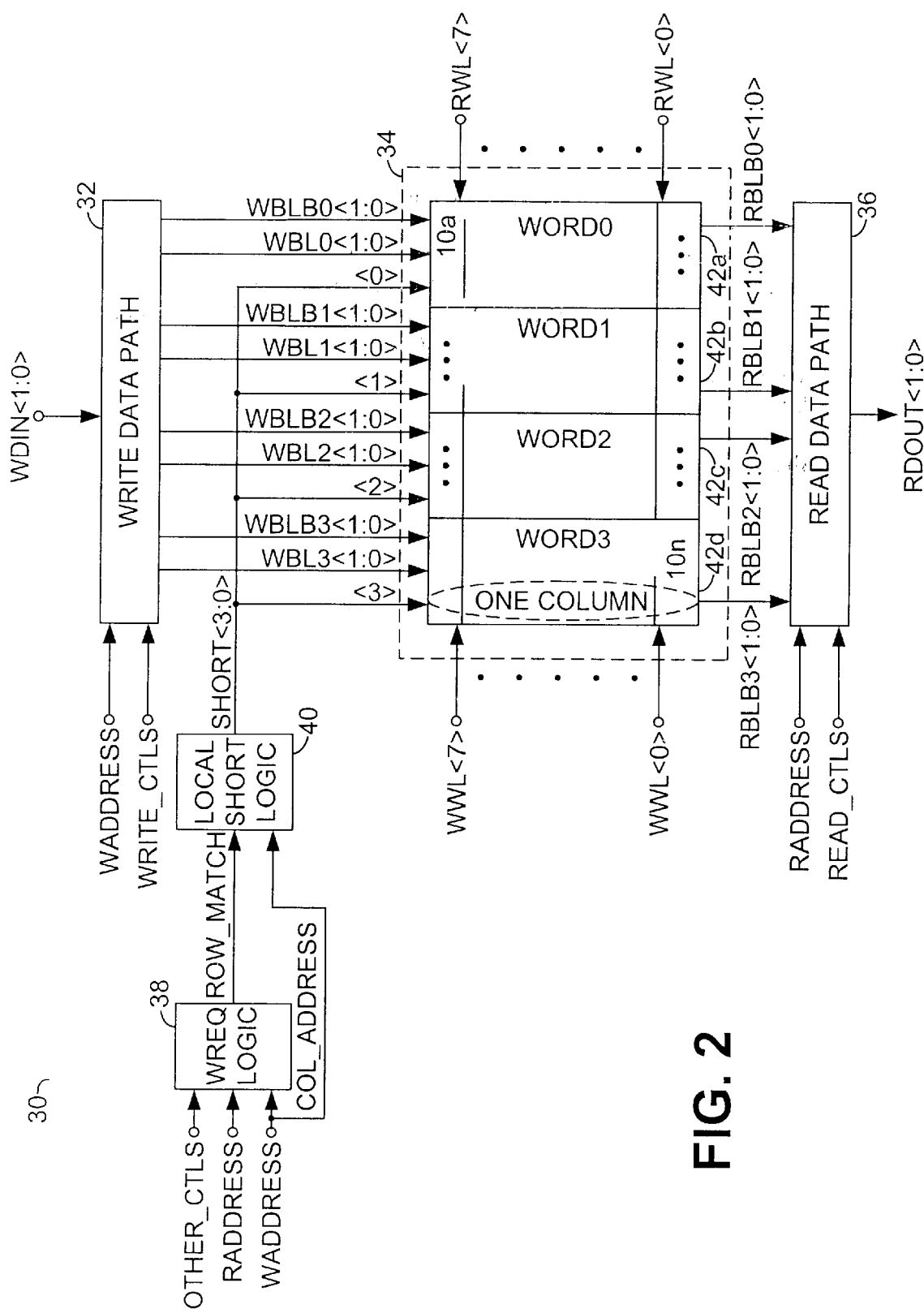
FIG. 2 is a block diagram of a conventional FIFO memory.

Referring to FIG. 7, a detailed block diagram of the circuit 126 of FIGS. 3 and 4 is shown. The circuit 230 may have an input that may receive the signal ADDR_MATCH, an input that may receive the signal OTHER_CTLS, an output 270 that may present a signal (e.g., BSHORTB), an output 272 that may present a signal (e.g., BSHORT), an output 274 that may present the signal DSHORTB, and an output 276 that may present the signal DSHORT. The signals BSHORT and BSHORTB may be complementary signals. The signals DSHORT and DSHORTB may be complementary signals. The signals BSHORT/BSHORTB and DSHORT/DSHORTB may control the coupling operation of the devices 236, 238, 232 and 234, respectively. The circuit 230 may be configured to generate the signals BSHORT/BSHORTB and DSHORT/DSHORTB in response to the signals ADDR_MATCH and OTHER_CTLS. In one example, the circuit 230 may be a short control buffer circuit. The circuit 230 provides the proper sequencing of enabling the bitline short devices 232 and 234 with respect to the dataline short devices 236 and 238. In one example, the signals BSHORT/BSHORTB may be generated before the signals DSHORT/DSHORTB.

The device 232 may have a first source/drain that may receive the dataline ADL, a gate that may receive the signal DSHORT, another gate that may receive the signal DSHORTB, and a second source/drain that may receive the dataline BDL. The device 234 may have a first source/drain that may receive the dataline bar ADLB, a gate that may receive the signal DSHORTB, another gate that may receive the signal DSHORT, and a second source/drain that may receive the dataline bar BDLB. The device 236 may have a first source/drain that may receive the bitline bar ABLB, a gate that may receive the signal BSHORTB, another gate that may receive the signal BSHORT, and a second source/drain that may receive the bitline bar BBLB. The device 238 may have a first source/drain that may receive the bitline ABL, a gate that may receive the signal BSHORT, another gate that may receive the signal BSHORTB, and a second source/drain that may receive the bitline BBL.

In one example, the devices 232, 234, 236, and 238 may be CMOS transmission gates or pass gates. However, other shorting (coupling) devices may be implemented to meet the design criteria of a particular application.

The circuit 126 may be configured to short (couple) the bitlines (e.g., ABL and BBL), the bitline bars (e.g., ABLB and BBLB), the datalines (e.g., ADL and BDL), and the dataline bars (e.g., ADLB and BDLB) between the ports in a multi-port memory array or first in, first out (FIFO) memory. The circuit 126 may be configured as a memory cell bypass circuit. The data may be read at the port A or the port B without going through the memory circuit 124. The fall-through timing when the circuit 100 is receiving simultaneous write and read instructions may be reduced. When multiple ports are not accessing a common address, the circuit 126 may allow normal access of the memory circuit 124 to be performed independently.

In one example, when the address accessed by a first port matches the address accessed by one or more other ports (e.g., the signals AADDRESS and BADDRESS match), a port arbitration logic circuit (not shown) may be configured to generate the address match signal ADDR_MATCH. The circuit 230 may assert the signals BSHORT, DSHORT, BSHORTB, and DSHORTB in response to the signals ADDR_MATCH and OTHER_CTLS. The control signals BSHORT, DSHORT, BSHORTB, and DSHORTB are generally asserted in response to an address match. The circuit 100 may use less current than conventional designs that assert short control signals whenever a row match is detected.

The bitlines ABL and BBL, the bitline bars ABLB and BBLB, the dataline bars ADLB and BDLB, and the datalines ADL and BDL may be precharged in response to an address transition. The bitlines ABL and BBL and the bitline bars ABLB and BBLB may be precharged to a logic high (1) state. The datalines ADL and BDL and the dataline bars ADLB and BDLB may be precharged to a logic low (0) state. Precharging may set up the circuit 100 for a read or a write operation. Precharging may aid the memory circuit 124 function during a read or a write operation.

During a read operation, the high trip-point sensing amplifiers 168 and 170 may place one or more of the dataline ADL, the dataline bar ADLB, the dataline bar BDLB, and the dataline BDL, respectively, in a logic high state ("1") based on data in the memory circuit 124. During a write operation, write data (e.g., the signals AWDATAB, AWDATA, BWDATA, and BWDATAB) may pull down the dataline ADL, the dataline bar!ADLB, the dataline bar BDLB, and/or the dataline BDL to a first state (e.g., a logic low or "0") by switching on one of the transistors 172 and 174. The precharge states of the datalines ADL and BDL and the dataline bars ADLB and BDLB may be flipped by old data on the bitline bars ABLB and BBLB and the bitlines ABL and BBL, respectively, before the write occurs. To flip the old data, the datalines ADL and/or BDL and/or the dataline bars ADLB and/or BDLB may need to be pulled down by using transistors 172 and 174.

During an example operation where port A is writing to and port B is reading from the same address, the bitline ABL and the bitline bar ABLB may be set to a first state (e.g., a logic low or ("0") or a second state (e.g., a logic high or ("1") by the devices 164 and 166. Since both ports have the same address, the devices 236 and 238 are enabled to short (i) bitline ABL to the bitline BBL and (ii) the bitline bar ABLB to the bitline bar BBLB. In this case, the memory circuit 124 is bypassed so that the access time using the circuit 126 may be less than the memory circuit 124 access time. Similarly, the datalines ADL and BDL and dataline bars ADLB and BDLB are shorted to prevent the port B sense amplifiers 168 and 170 from producing crowbar current.

Some of the improvements of the circuit 100 over the conventional FIFO and the conventional dual port memory may be summarized as shown in the following TABLE 1:

TABLE 1

| Description | Conventional | Present Invention |
| --- | --- | --- |
| FIFO bitline short | Same row access only | Same address access |
| FIFO dataline | N/A | Same address access |
| FIFO WREQ logic | Yes | Not required, shared with arbitration logic |
| Dual port bitline short | No | Same as for FIFO |
| Dual port dataline short | No | Same as for FIFO |

However, those skilled in the art will recognize that the objects, features, and advantages of the present invention are not limited to those listed in TABLE 1.

Figure 8:
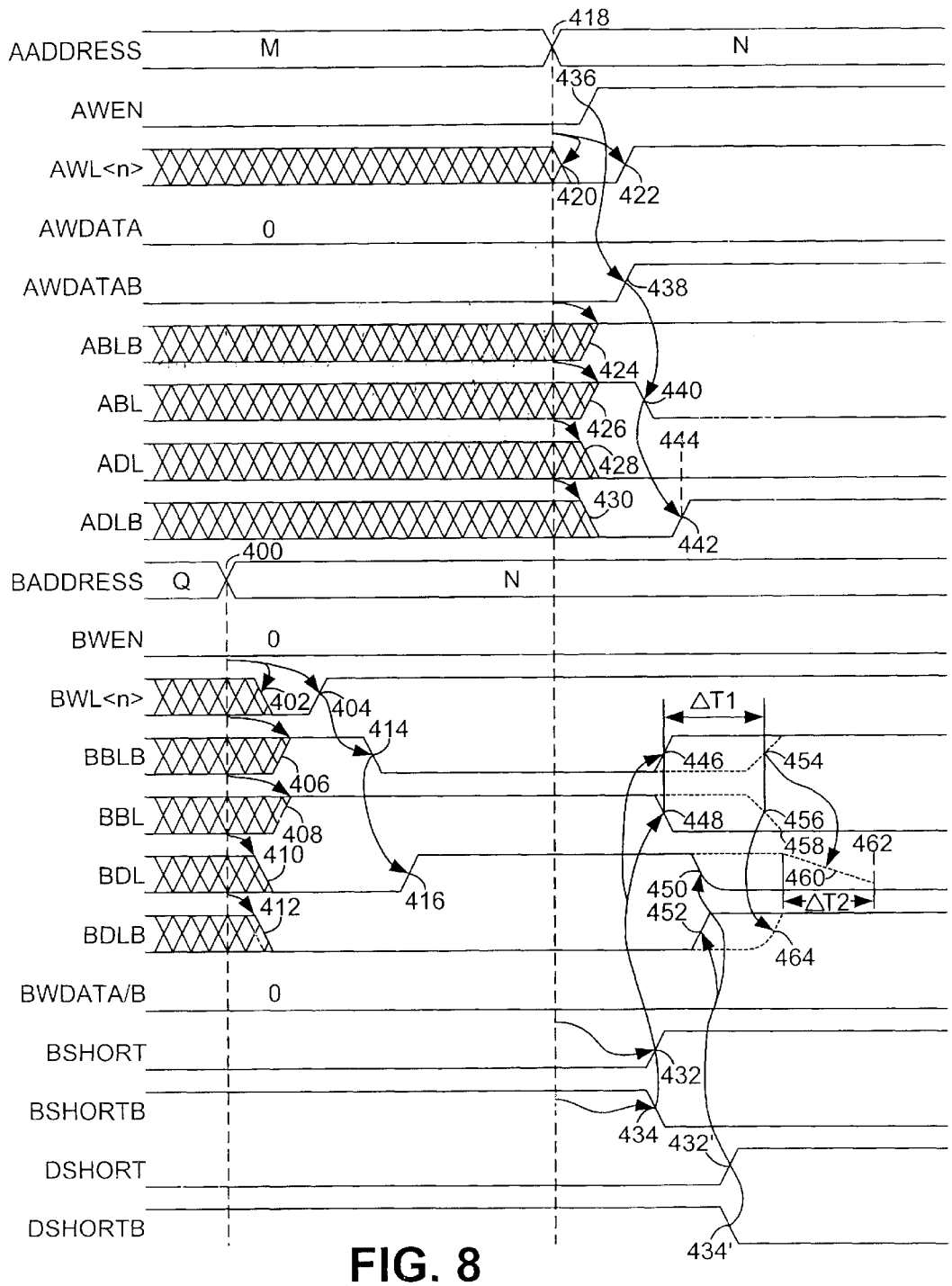
FIG. 8 is a timing diagram illustrating example waveforms of the present invention.

Referring to FIG. 8, a timing diagram illustrating example waveforms of the circuit 100 is shown. In one example, a write-through operation may be performed with simultaneous write and read access requests at the same memory cell 202.

The signal BADDRESS (e.g., port B address) may change from a value Q to the value N at a time 400. The wordline BWL<n> may have a negative transition 402 and a positive transition 404, the bitline bar BBLB may have a positive transition 406, the bitline BBL may have a positive transition 408, the dataline BDL may have a negative transition 410, and the dataline bar BDLB may have a negative transition 412 in response to the change of the signal BADDRESS. The transition 404 of the wordline BWL<n> generally occurs after the transition 406 of the bitline bar BBLB and the transition 408 of the bitline BBL. The bitline bar BBLB may have a negative transition 414 in response to the positive transition 404 of the wordline BWL<n>. The dataline BDL may have a positive transition 416 in response to the transition 414 of the bitline bar BBLB.

The signal AADDRESS (e.g., port A address) may change from a value M to a value N at a time 418. The wordline AWL<n> may have a negative transition 420 and a positive transition 422, the bitline bar ABLB may have a positive transition 424, the bitline ABL may have a positive transition 426, the dataline ADL may have a negative transition 428, the dataline bar ADLB may have a negative transition 430, the signals BSHORT and DSHORT may have a positive transition 432 and 432', respectively, and the signals BSHORTB and DSHORTB have a negative transition 434, 434' respectively in response to the change of the signal AADDRESS at the time 418.

The signal AWEN may have a positive transition 436. The signals AWDATA, BWEN, BWDATA and BWDATAB may remain in a logic low state during the example write-through operation illustrated. The signal AWDATAB may have a positive transition 438 in response to the transition 436 of the signal AWEN. The bitline ABL may have a negative transition 440 in response to the transition 438 of the signal AWDATAB. The dataline bar ADLB may have a positive transition 442 in response to the transition 440 of the bitline ABL. The dataline bar ADBLB may be in a logic high state after a time 444.

The bitline bar BBLB may have a positive transition 446, the bitline BBL may have a negative transition 448, the dataline BDL may have a negative transition 450, and the dataline bar BDLB may have a positive transition 452 in response to the transitions 432 and 432' of the signals BSHORT and DSHORT, respectively, and the transitions 434 and 434' of the signals BSHORTB and DSHORTB, respectively.

When a conventional dual port memory is implemented, the bitlines ABL and BBL and the bitline bars ABLB and BBLB are not shorted together. The bitline bar BBLB can have a positive transition 454 and the bitline BBL can have a negative transition 456 in response to simultaneous write and read requests at the same memory cell of the conventional memory. The transition 456 of the bitline BBL can be completed at a time 458. The transition 454 of the bitline bar BBLB can be delayed relative to the transition 446 and the transition 456 of the bitline BBL can be delayed relative to the transition 448 by a time ΔT1. Delay ΔT1 can be the extra time required for write-through of the conventional memory.

During another example operation of a conventional memory the bitlines ABL and BBL, the bitline bars ABLB and BBLB, the datalines ADL and BDL, and the dataline bars ADLB and BDLB are not shorted together. The transition 454 of the bitline bar BBLB can provide a negative transition 460 of the dataline BDL in response to simultaneous write and read requests at the same memory cell. The transition 460 can be completed at a time 462. The dataline bar BDLB can have a positive transition 464 in response to the transition 456 of the bitline BBL. The difference from the time 458 to the time 462 may be a time delay ΔT2. The time delay ΔT2 may be due to the slow pull down time of amplifiers 168 and 170 when implemented as high trip point devices. The delay ΔT2 may be in addition to the delay ΔT1. The delay ΔT2 may cause large crowbar currents in the next stage due to slow signal slew rates driving CMOS logic gates which allows both the PMOS pull-up paths and NMOS pull-down paths to be active at the same time, hence causing crowbar current. The circuit 100 in accordance with the present invention may eliminate (or minimize) time delays ΔT1 and ΔT2.

Figure 9A:
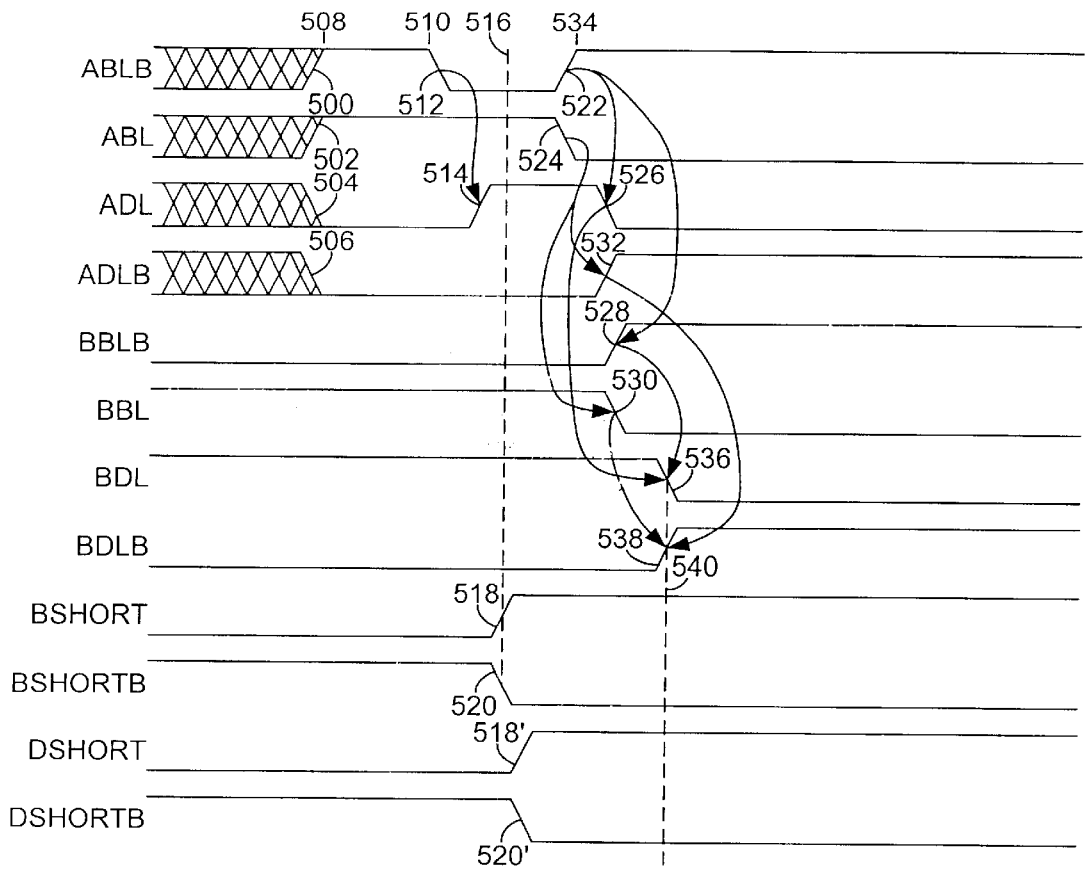
FIGS. 9a–9c are timing diagrams illustrating further example waveforms of the present invention.
Figure 9B:
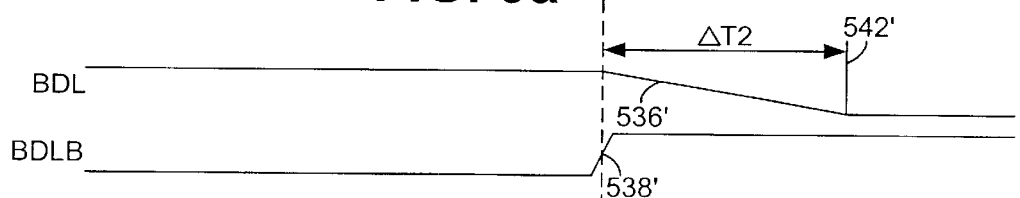
Figure 9C:
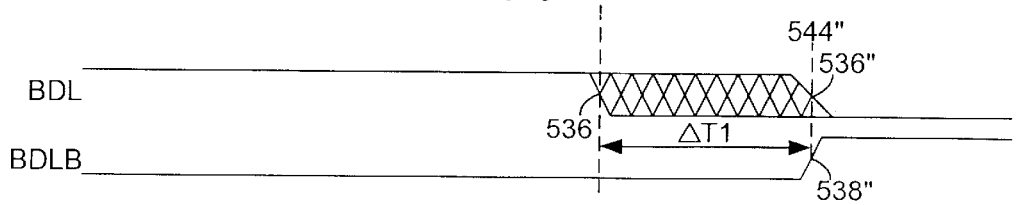

Referring to FIGS. 9a–9c, timing diagrams illustrating waveforms during other examples of operation of the circuit 100 are shown. FIGS. 9a–9c may illustrate operations where signals BSHORT, DSHORT, BSHORTB, and DSHORTS may be active and stable and port A data (e.g., the bitline bar ABLB, the bitline ABL, the dataline ADL, and the dataline bar ADLB) may change. The change of the bitline bar ABLB, the bitline ABL, the dataline ADL, and the dataline bar ADLB may cause the bitline bar BBLB, the bitline BBL, the dataline BDL, and the dataline bar BDLB to transition as described below.

Referring to FIG. 9a, a timing diagram illustrating the behavior of the invention when the addresses of the ports are the same and Port A attempts to write new data into the memory cell. The waveforms during a write-through when bitline ABL, bitline bar ABLB, dataline ADL, and dataline bar ADLB (e.g., the port A data) change are illustrated. The bitline bar ABLB may have a positive transition 500, the bitline ABL may have a positive transition 502, the dataline ADL may have a negative transition 504, and the dataline bar ADLB may have a negative transition 506, each in response to a memory access on port A. A transition 500 of the bitline bar ABLB may be completed at a time 508. At the time 508, the bitline bar ABLB may be in a logic high (1) state. At a time 510, the bitline bar ABLB may have a negative transition 512 in response to the memory access. The dataline ADL may have a positive transition 514 in response to a transition 512 of the bitline bar ABLB. A transition 514 of the dataline ADL may be completed at a time 516. At the time 516 the signals BSHORT and DSHORT may have a positive transition 518 and 518' and the signals BSHORTB and DSHORTB may have a negative transition 520 and 520', in response to the assertion of the signal ADDR_MATCH.

After the time 516 the bitline bar ABLB may have a positive transition 522 and the bitline ABL may have a negative transition 524, each in response to a write access on port A. The dataline bar ADLB may have a positive transition 532, and the bitline BBL may have a negative transition 530, each in response to the negative transition 524 of the bitline ABL. The dataline ADL may have a negative transition 526, and the bitline bar BBLB may have a positive transition 528, each in response to the positive transition 522 of the bitline bar ABLB. At a time 534, the bitline bar ABLB may be in a logic high state and the bitline ABL may be in a logic low state. Before the time 534, the data presented at the port A may be uncertain and/or old data. After the time 534, the data presented at the port A may be new data.

The dataline BDL may have a negative transition 536 in response to the transition 526 of the dataline ADL and the transition 528 of the bitline bar BBLB. The dataline bar BDLB may have a positive transition 538 in response to the transition 532 of the dataline bar ADLB and the transition 530 of the bitline BBL. The transitions 536 and 538 may be complete at a time 540. The dataline BDL may be in a logic low state and the dataline bar BDLB may be in a logic high. state at the time 540.

Referring to FIG. 9b, an illustration of waveforms for an example of a memory circuit where the bitlines ABL and BBL and bitline bars ABLB and BBLB are shorted, but the datalines ADL and BDL and the dataline bars ADLB and BDLB are not shorted, is shown. The dataline BDL has a negative transition 536' in response to the positive transition 528 of the bitline bar BBLB. The positive transition 528 responds to the transition 522 of the bitline bar ABLB. The transition 536' of the dataline BDL may be completed at a time 542'. The difference between the time 540 and the time 542' may be the time delay ΔT2.

Referring to FIG. 9c, an illustration of waveforms for an example of a circuit where the bitlines ABL and BBL and the bitline bars ABLB and BBLB are not shorted, but the datalines ADL and BDL and the dataline bars ADLB and BDLB are shorted, is shown. The dataline BDL may have a negative transition 536" in response to the transition 526 of the dataline ADL (and the transition 528). The dataline bar BDLB may have a positive transition 538 in response to the transition 532 of the dataline ADLB (and the transition 530). The dataline BDL transition 536" may be completed at a time 544". The difference in time between the time 540 and the time 544" may be the time delay ΔT1. The transition 536" of the dataline BDL may be delayed relative to the transition 536. The transition 538" of the dataline bar BDLB may be delayed relative to the transition 538 by the time delay ΔT1.

While the circuit 100 has been shown implemented in a dual port memory circuit, in another example, the memory circuit may be a multiple port memory circuit with any number of ports (e.g., quadport, etc.).

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a memory array having a first port and one or more other ports; and
   a control circuit configured to couple (i) a bitline of said first port to a corresponding bitline of said one or more other ports and (ii) a dataline of said first port to a corresponding dataline of said one or more other ports in response to a common address accessing said first port and said one or more other ports.

2. The apparatus according to claim 1, wherein said control circuit further comprises a short control circuit configured to present one or more short control signals in response to said common address accessing said ports.

3. The apparatus according to claim 2, wherein said control circuit comprises one or more transmission gates or one or more pass gates.

4. The apparatus according to claim 1, wherein said accessing comprises an operation selected from the group consisting of a read/read, a write/write, a write/read, and a read/write.

5. The apparatus according to claim 1, further comprising:
   a logic circuit configured to detect said common address accessing said ports.

6. The apparatus according to claim 1, wherein said memory array is configured as a first in, first out (FIFO) memory.

7. The apparatus according to claim 1, wherein said memory array is configured as a dual port memory.

8. The apparatus according to claim 1, wherein said apparatus comprises a hybrid dual port/FIFO memory.

9. The apparatus according to claim 1, wherein said ports comprise one or more first amplifiers configured to generate one or more signals carried by said bitlines.

10. The apparatus according to claim 9, wherein said ports further comprise one or more second amplifiers configured to receive one or more of said bitlines and present one or more of said datalines in response to said one or more of said bitlines.

11. The apparatus according to claim 10, wherein said one or more second amplifiers further comprise sense amplifiers.

12. The apparatus according to claim 11, wherein said sense amplifiers are configured to sense a transition of said one or more signals carried by said bitlines.

13. The circuit according to claim 1, wherein said ports further comprise one or more transistors configured to pull down said signals carried by said datalines.

14. The apparatus according to claim 10, wherein said memory array further comprises a plurality of memory cells, wherein each of said memory cells further comprises one or more amplifiers configured to be weaker than said one or more first amplifiers.

15. The apparatus according to claim 1, wherein said apparatus further comprises a dynamic column load circuit configured to precharge said bitlines before said memory array is accessed.

16. An apparatus for bypassing a memory cell in a multi-port memory having a first port and one or more other ports comprising:
    means for detecting a common address accessing multiple ports;
    means for coupling a first port bitline to one or more other port bitlines; and
    means for coupling a first port dataline to one or more other port datalines.

17. A method of bypassing a multi-port memory cell comprising the steps of:
    (A) detecting a common address accessing multiple ports;
    (B) coupling a first port bitline to one or more other port bitlines; and
    (C) coupling a first port dataline to one or more other port datalines.

18. The method according to claim 17, wherein said multiple port accessing comprises an operation selected from the group consisting of a read/read, a write/write, a write/read, and a read/write.

19. The method according to claim 17, wherein said step (A) further comprises the sub-step of:
    generating a signal indicating a fall-through condition using a logic circuit.

20. The method according to claim 17, further comprising the steps of:
    coupling said first port bitline to said one or more other port bitlines in response to a short control circuit; and
    coupling said first port dataline to said one or more other port datalines in response to said short control circuit.

* * * * *